United States Patent

[11] 3,621,114

[72] Inventors Josef Ref
Los Angeles;
Mort Finhill, Palos Veedes Peninsula, both of Calif.
[21] Appl. No. 851,304
[22] Filed Aug. 19, 1969
[45] Patented Nov. 16, 1971
[73] Assignee TWR Semiconductors, Inc.
Lawndale, Calif.

[54] LEAD FRAME CONFIGURATION
10 Claims, 4 Drawing Figs.

[52] U.S. Cl. .......... 174/52 PE, 29/193.5, 29/589, 317/234 E, 317/234 J
[51] Int. Cl. .......... H05k 5/00
[50] Field of Search .......... 174/52 S, 52 PE, DIG. 3; 317/101 A, 101 CC, 234 (5.3), 234 (5.4), 234 (13); 29/588–590; 264/272

[56] References Cited
UNITED STATES PATENTS
3,348,105 10/1967 Doyle .......... 317/234 E UX
3,444,441 5/1969 Helda et al. .......... 174/52 PE X
3,484,659 12/1969 Nagai et al. .......... 317/234 E

*Primary Examiner*—Darrell L. Clay
*Attorney*—Spensley, Horn & Lubitz

ABSTRACT: A lead frame configuration for the concurrent fabrication of a plurality of semiconductor devices. Two lead frame structures, each having an elongated metallic member with a plurality of leads integral with the metallic member and extending substantially perpendicular therefrom in parallel alignment, are axially opposed to one another. The leads of each frame structure are spaced substantially equidistant from each other, joined by an intermediate crossmember substantially parallel to the elongated metallic strip. The opposing ends of each lead frame have a resilient receiving member adapted for contacting a surface of a semiconductor device. The method includes the steps of bonding the semiconductor devices to the lead frames, encapsulating the semiconductor devices and severing the individual semiconductor devices from the completed structure.

INVENTORS.
JOSEF REF,
MORT FINHILL,
BY THEIR ATTORNEYS
Spensley & Horn.

LEAD FRAME CONFIGURATION

BACKGROUND OF THE INVENTION

1. Field of the Invention

The present invention relates generally to the field of semiconductor devices, and more specifically to structures used to provide concurrent fabrication of a plurality of devices.

2. Prior Art

In order to produce a semiconductor device of good quality, the early methods disclosed by the prior art were all manual operations relating to individual devices. Specifically, to fabricate a device comprised of stacked silicon dice having PN junctions disposed therein required time-consuming operations. One of the methods disclosed by the prior art requires that the opposite surfaces of a semiconductor dice be bonded to leads which are in separated, parallel planes where the leads overlap in the areas substantially adjacent the surfaces of the dice. A problem inherent in this method is structural strength. The fact the leads are not axially opposed can cause cracking in the encapsulating material. In addition, the tortional stress created by the offcentered leads can weaken the bond between the lead and the surface of the dice. The prior art discloses the use of comblike frames for the mass production of the above-described devices, but these suffer from the same problem. The present invention lead frame configuration solves these problems by utilizing axially opposed leads with resilient connections to the surface of the dice.

The fabrication of devices utilizing stacked dice is disclosed by the prior art, but problems inherent in this method are solved by the present invention. The prior art uses a scrubbing technique to bond a lead to one end surface of the stacked dice. The other lead is in an offset parallel plane and spacially overlapping the first lead in the area of the surface of the dice. Since the dice are stacked, scrubbing can't be used on the second surface, therefore the use of a heated vibrating element serves to implement the bond. This technique produces poor contacts when the number of stacked dice is extended. The method fails because of heat dissipation through the stack dice. In addition, the technique cannot be used for the mass production of semiconductor devices. The present invention solves this problem by inserting solder preforms between the surface of the dice and the resilient receiving contact of the lead frame, then subjecting the entire array to a heated environment wherein the temperature exceeds the melting temperature of the solder preforms.

SUMMARY OF THE INVENTION

It is an object of the present invention to provide a lead frame configuration to improve fabrication of stacked semiconductor devices.

It is another object of the present invention to provide an improved method to fabricate stacked diodes wherein the structure and method make it more amenable to automated processes.

It is yet another object of the present invention to provide a lead frame configuration capable of withstanding increased axial stress.

It is still yet another object of the present invention to provide a more economical method of mass producing semiconductor devices.

The present invention lead frame configuration and method of using same provide a more economical means of manufacturing encapsulated semiconductor devices in general and stacked diode devices specifically. Two identical arrays of substantially equidistant, parallel metal leads are utilized. Each array has an elongated metal strip on which the substantially parallel metal leads depend. The angle between the metal leads and the elongated metal strip is approximately a right angle. A metal crossmember joins the metal leads at a point near but not adjacent the other end of the leads. The crossmember is substantially parallel to the elongated metal strip. That part of the metal leads extending beyond the crossmember are to contact the surface of the semiconductor device, therefore the leads are provided with a resilient, flexible contact.

One of the arrays is vertically inserted into a holding structure after which preformed soldered chips, stacked dice and the second array are properly oriented. The lead frame configuration is weighted to place the resilient contact under stress, the configuration then being heated to bond the lead contact to the end surfaces of the stacked semiconductor device.

The resulting lead frame configuration has axially opposed leads which are resiliently coupled to the stacked semiconductor dice. The present invention provides the means for the mass production of semiconductor devices wherein good contact bonds can be reliably produced. In addition, the connections between the leads and the surfaces of the semiconductor dice are mechanically improved over prior art devices thereby providing devices which will stand greater mechanical stress.

The novel features which are believed to be characteristic of the present invention, both as to organization and method of operation, together with further objectives and advantages thereof will be better understood in the following description considered in connection with the accompanying drawing wherein a presently preferred embodiment of the invention is illustrated by way of example. It is to be expressly understood, however, that the drawing is for the purpose of illustration and description only, and is not intended as a definition of the limits of the invention.

DESCRIPTION OF THE PRESENTLY PREFERRED EMBODIMENTS

Figure 1:
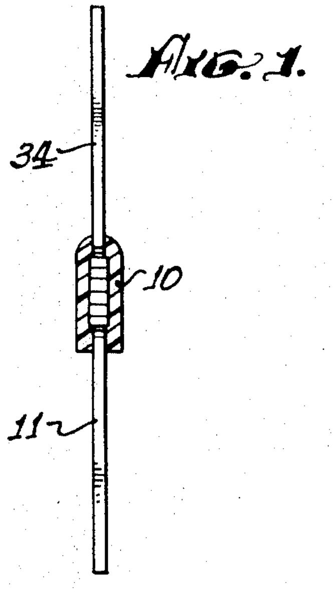
FIG. 1 is an enlarged front view of the stacked diode fabricated in accordance with the present invention.

An illustration of a diode fabricated in accordance with the present invention can be best seen by reference to FIG. 1 wherein the encapsulated diode is generally indicated by reference number 10. The two leads 11 and 34 extending from the diode 10 are aligned along the axis of the device. The specific device being fabricated and the number of leads used therefor are not part of the present invention. The use of an encapsulated diode 10 with two leads 11 and 34 are for the purpose of example and description only. An objective of the present invention lead frame configuration is to provide the means for mass production of semiconductor devices. To achieve this objective, the embodiment illustrated utilized a flat sheet of conventional contact metal such as Kovar.

Figure 2:
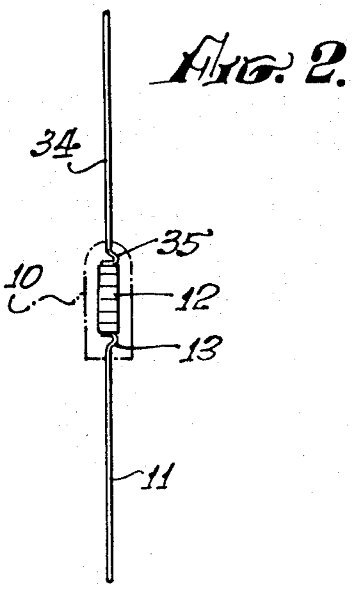
FIG. 2 is an enlarged transparent view of the stacked diode fabricated in accordance with the present invention.

The construction of the diode 10 in accordance with the present invention, can be best seen by reference to the transparent view illustrated in FIG. 2. The view of the encapsulated diode 10 in FIG. 2 shows the profile of the processed leads 11 and 34. The leads 11 and 34 are axially opposed to one another. The adjacent ends of the leads 11 and 34 are adapted to contact the end surfaces of the semiconductor element 12, the adaptation being the resilient hook-shaped contacts 13 and 35. The specific device represented by the stacked dice 12 can be a conventional device, the device and the particular materials used not being a part of the present invention, the stacked diode 10 being for the purpose of example and description only. The bonds between the end surfaces of the stacked diode 12 and the contacts 13 and 35 can be made by any conventional bonding agent consistent with the material being used, but it is preferably a gold-germanium eutectic.

Figures 3, 4:
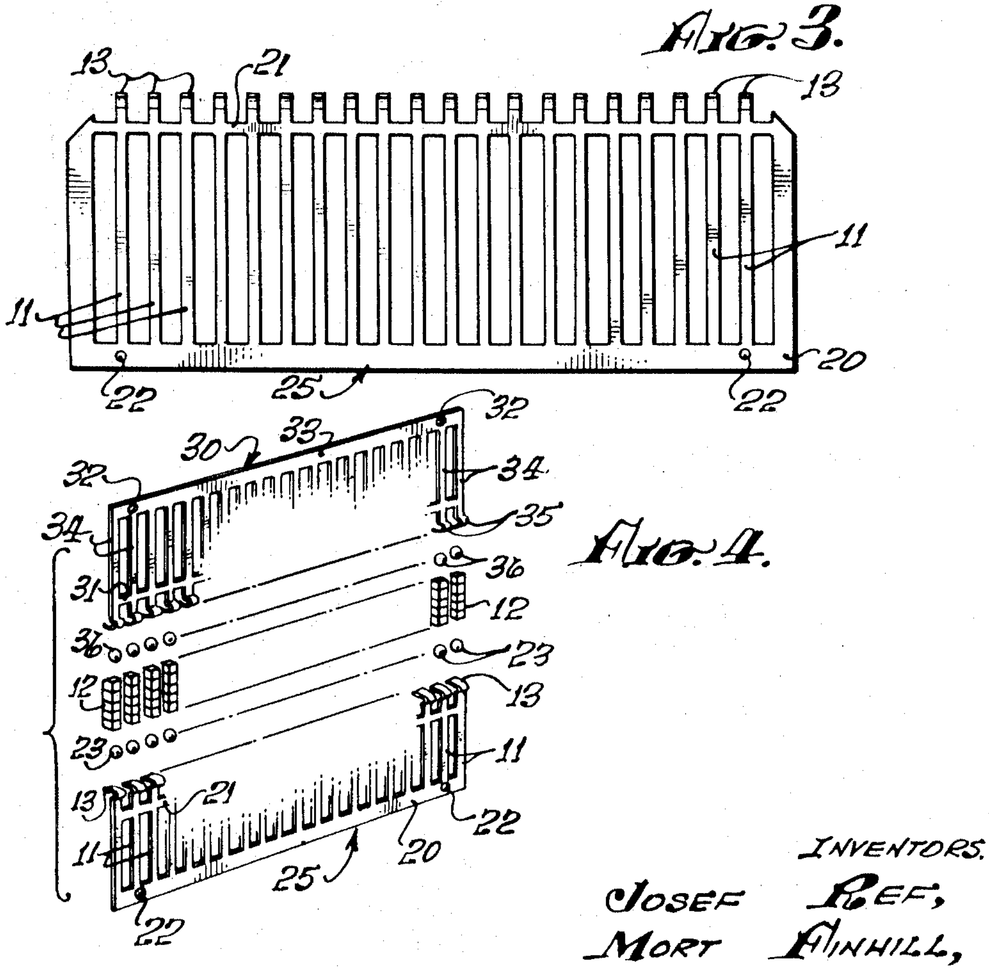
FIG. 3 is a lead frame configuration used for the concurrent fabrication of a plurality of semiconductor devices.
FIG. 4 is an enlarged, exploded view illustrating the fabrication of stacked diode devices utilizing the lead frame configuration of FIG. 3.

The lead frame 25 utilized by the present invention is shown in FIG. 3. An elongated metal strip 20 has apended at right angles thereto, parallel, substantially equidistant leads 11. The holes 22 in the elongated metal strip 20 are for registration of the lead frame configuration within a fabrication mold. The crossmember 21 joins the leads 11 at a point near but not at the end of the lead 11 at a point near but not at the end of the lead 11, the crossmember 21 giving structural rigidity to the lead frame 25. The crossmember 21 is substantially parallel to the elongated strip 20.

The end of the leads 11 are formed into hook-shaped resilient contacts 13. The use of the resilient contact 13 to make electrical or mechanical connection to the surface of the stacked diode 12 provides two advantages. The mechanical connection is improved over that disclosed by the prior art because of the stress relief afforded by the yielding resiliency of the contact 13. The electrical contact between the resilient contact 13 and the surface of the semiconductor dice is improved because the connection is made while the frame configuration is under stress.

The manner in which the present invention lead frame configuration is utilized can be best seen by reference to FIG. 4. The lead frame 25 is inserted into a mold or other means for vertically aligning the member. The holes 22 will be used for providing proper registration of the lead frame 25 within the assembly fixture. Solder preforms 23 will be disposed upon the top surface of the resilient contact 13. The solder preforms 23 are conventional, known materials that will be consistent with the dice and lead materials being used. In the case where the Kovar frame and silicon dice are employed, a gold-germanium eutectic will be a proper solder material.

The stacked dice semiconductor elements 12 are then placed upon the solder preforms 23. The semiconductor element 12 illustrated in FIG. 4 are stacked diodes. Each of the individual dice in the stack has a PN junction disclosed therein, the five dice being stacked to derive the desired electrical characteristics for the diode. The semiconductor dice are of conventional materials, such as silicon, the specific material and the number of dice used to derive the desired characteristics not being part of the present invention.

After the disposition of the stacked diodes 12, solder preforms 36 are placed upon the upper surface thereof. As in the case of the solder preforms 23, the solder preforms 36 will typically be a gold-germanium eutectic. The second lead frame 30 is placed upon the stacked assembly, the leads 34 being in axial opposition with the leads 11 of the lead frame 25. The orientation of the resilient contacts 35 can be the same or opposite that of the resilient contacts 13, therefore, the lead frames 30 and 25 will be identical. The crossmember 31 joins all of the substantially parallel, equidistant leads 34, the crossmember 31 being substantially parallel to the elongated strip 33. The holes 32 in the elongated strip 33 provide the same functions as the holes 22 in the elongated strip 20. The assembly will be put under stress by placing a weighted element upon the elongated strip 33 thereby compressing the resilient contacts 13 and 35. It would be obvious to one with skill in the art that the assembly could be fabricated in other than a vertical plane, the orientation set forth above being the easiest to implement.

The entire present invention lead frame configuration is placed in a heated environment sufficient to melt the solder preforms 23 and 36. The final steps in implementing the present invention comprise the steps of encapsulating the device in plastic and severing the lead frame interconnections. The encapsulation of the device is carried out by molding a plastic package 10 around the individual semiconductor devices 12 and the connections thereto. The materials used for encapsulation are conventional materials such as silicon plastics. The individual diodes 10 are separated by severing those parts of the crossmembers 21 and 31 between leads 11 and 34 respectively, and as a final step, shearing off the elongated strips 20 and 33.

We claim:

1. An article of manufacture comprising:

a. semiconductor elements having portions thereof for making electrical and mechanical contact thereto;

b. a first and second metal lead frame each having a plurality of interconnected, substantially parallel leads, the leads of said first lead frame being axially opposed to those of said second lead frame;

c. contact means at an end of each of said plurality of leads for contacting said portions of said semiconductor element;

d. conductive bonding layers disposed between and joined to each of said semiconductor element portions and said respective contact means; and e. an encapsulating layer disposed about each of said semiconductor elements and the connections thereto.

2. An article of manufacture as in claim 1 wherein said contact means is a resilient, hook-shaped contact.

3. A lead frame as in claim 1 wherein said leads are equidistant from each other.

4. An article of manufacture comprising:

a. semiconductor elements having portions thereof form making electrical and mechanical contact thereto;

b. a pair of metal lead frames, each lead frame comprising:

1. an elongated strip having a plurality of leads each depending therefrom at a substantially right angle thereto, said leads of one lead frame being substantially in axial opposition to said leads of said other lead frame;

2. a crossmember connected to said plurality of leads between said elongated strip and an end of said plurality of leads, said crossmember being substantially parallel to said elongated strip;

3. contact means depending from said lead ends for contacting said portions of said semiconductor element;

c. conductive bonding layers disposed between and joined to each of said semiconductor element portions and said respective contact means; and d. an encapsulating layer disposed about each of said semiconductor elements and connections thereto.

5. An article of manufacture as in claim 4 wherein said contact means is a resilient, hook-shaped contact.

6. A lead frame as in claim 4 wherein said leads are equidistant from each other.

7. A lead frame as in claim 4 wherein said elongated strips and said cross-sectional members are severable.

8. An article of manufacture comprising:

a. a plurality of semiconductor elements having a first and second portion thereof for making electrical and mechanical contact thereto;

b. a first and second metal contact frame, each of said lead frames comprising:

1. a severable elongated metal strip;

2. a plurality of leads depending from said elongated strip, said leads being substantially parallel and equidistant from each other and approximately at a right angle to said elongated strip;

3. a severable metal crossmember connecting said plurality of leads between said elongated strip and ends of said leads, said crossmember being substantially parallel to said elongated strip;

4. a substantially hook-shaped contact at said end of each of said plurality of leads;

c. a conductive bonding layer disposed between and joined to each of said first and second portions of each of said semiconductor elements and one of said contacts of said first and second lead frames respectively, the leads of said first and second lead frames being axially opposed to one another; and, d. an encapsulating layer disposed about each of said semiconductor elements and the connections thereto.

9. A method for the fabrication of semiconductor devices comprising the steps of:

a. providing a plurality of semiconductor elements having portions thereof for making electrical and mechanical contact thereto;

b. providing a first and second metal lead frame comprising a plurality of parallel leads being connected at a first end thereof by a severable elongated strip and at a location between said elongated strip and a second end of said leads by a severable crossmember, said second end being resiliently adapted for mechanical and electrical contact;

c. connecting said second end of said first and second lead frames to said portions of said plurality of semiconductor elements establishing said leads of said first and second lead frames in axial opposition with one another;

d. encapsulating each of said semiconductor elements and connections thereto; and, e. severing said crossmembers and elongated strips from said leads.

10. A method as in claim 9 wherein a semiconductor element of stacked silicon dice is provided.

* * * * *